United States Patent
Kalz

(10) Patent No.: US 8,564,026 B2
(45) Date of Patent: Oct. 22, 2013

(54) CHIP, METHOD FOR PRODUCING A CHIP AND DEVICE FOR LASER ABLATION

(75) Inventor: Franz-Peter Kalz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 126 days.

(21) Appl. No.: 13/248,087

(22) Filed: Sep. 29, 2011

(65) Prior Publication Data

US 2012/0074598 A1    Mar. 29, 2012

(30) Foreign Application Priority Data

Sep. 29, 2010 (DE) .......................... 10 2010 046 966

(51) Int. Cl.
*G01N 29/02* (2006.01)

(52) U.S. Cl.
USPC ............... 257/254; 257/E21.596; 257/186; 257/788; 438/50; 438/52; 438/53

(58) Field of Classification Search
USPC ........... 257/E21.596, E23.148, E51.018, 40, 257/186, 254, 788; 156/345, 626, 643, 656, 156/659.1, 662; 438/50, 52, 53, 166, 487, 438/795; 216/60
See application file for complete search history.

(56) References Cited

U.S. PATENT DOCUMENTS

| | | | | |
|---|---|---|---|---|
| 4,902,631 A * | 2/1990 | Downey et al. ................. | 438/10 |
| 4,975,141 A * | 12/1990 | Greco et al. .................... | 216/60 |
| 5,386,430 A * | 1/1995 | Yamagishi et al. ............. | 372/57 |
| 5,412,679 A * | 5/1995 | Hung et al. ................. | 372/45.01 |
| 5,622,567 A * | 4/1997 | Kojima et al. ................. | 118/726 |
| 6,107,107 A * | 8/2000 | Bruce et al. ..................... | 438/14 |
| 6,398,349 B1 * | 6/2002 | Murai .............................. | 347/68 |
| 6,811,938 B2 * | 11/2004 | Tutt et al. ........................ | 430/22 |
| 7,052,968 B1 * | 5/2006 | Lee et al. ...................... | 438/401 |
| 7,247,813 B2 * | 7/2007 | Jyumonji et al. ........ | 219/121.83 |
| 7,429,522 B2 * | 9/2008 | Matsumura et al. .......... | 438/462 |
| 7,510,818 B2 * | 3/2009 | Chen et al. .................... | 430/320 |
| 7,537,878 B2 * | 5/2009 | Song et al. ..................... | 430/199 |
| 7,792,007 B2 * | 9/2010 | Hatano et al. ............. | 369/112.29 |
| 7,906,223 B2 * | 3/2011 | Rakow et al. ................. | 428/689 |
| 8,192,820 B2 * | 6/2012 | Asplund et al. .............. | 428/64.1 |
| 8,298,753 B2 * | 10/2012 | Staub et al. ................... | 430/321 |
| 8,298,905 B2 * | 10/2012 | Ito ................................. | 438/385 |
| 2006/0001116 A1 | 1/2006 | Auburger et al. | |
| 2008/0050851 A1 | 2/2008 | Tanaka et al. | |

FOREIGN PATENT DOCUMENTS

| | | |
|---|---|---|
| AT | 010543 U1 | 5/2009 |
| DE | 2503057 A1 | 7/1976 |
| DE | 19717912 A1 | 11/1997 |
| EP | 1602625 B1 | 12/2007 |
| WO | 2009070817 A1 | 6/2009 |

OTHER PUBLICATIONS

Malcom Gower and Nadeem Rizvi Applications of Laser Ablation to Microengineering Exitech Limited Hanborough Park, Long Hanborough, Oxford, United Kingdom, 2010.
English language abstract of DE 19717912 A1, Oct. 2010.

* cited by examiner

*Primary Examiner* — Chris Chu

(57) ABSTRACT

In various embodiments, a chip may include a substrate; a coating, the coating covering the substrate at least partially and the coating being designed for being stripped at least partially by means of laser ablation; wherein between the substrate and the coating, a laser detector layer is arranged at least partially, the laser detector layer being designed for generating a detector signal for ending the laser ablation.

17 Claims, 2 Drawing Sheets

CHIP, METHOD FOR PRODUCING A CHIP AND DEVICE FOR LASER ABLATION

CROSS-REFERENCE TO RELATED APPLICATION

This application claims priority to German Patent Application Serial No. 10 2010 046 966.1, which was filed Sep. 29, 2010, and is incorporated herein by reference in its entirety.

TECHNICAL FIELD

Various embodiments relate to a chip, a method for producing a chip and a device for laser ablation.

BACKGROUND

It is known to coat a chip with a protective layer, for example of a plastic, for protection against external influences. If the chip is, for example, a semiconductor chip with a sensor area, the sensor area, after having being coated with the protective layer, must be exposed again in order to ensure reliable operation of the sensor area and thus of the entire sensor.

From EP 1 602 625 B1, a semiconductor module and a method for producing it is known, the semiconductor module having a semiconductor sensor chip and a housing. The sensor chip has a sensor area in the housing and is electrically connected to at least one further component of the semiconductor module in the form of a semiconductor chip or of a passive component. The electrical connection, the further component and the non-sensitive areas of the sensor chip are embedded in a non-transparent plastic housing compound. The sensor area of the sensor chip, however, is actively connected to the environment via an opening in the non-transparent plastic housing compound, the opening exhibiting a laser stripping cone.

Stripping the plastic housing compound and thus exposing the sensor area is done by means of laser technology. Whereas the areal extent of the sensor area, and thus of the laser stripping cone, can be reliably adjusted using modern laser ablation technology, it is currently not possible to set the desired depth of the laser stripping cone accurately down to the sensor area or, respectively, it is not possible to reliably detect that the sensor area has been reached and to correspondingly stop the laser ablation. If the laser ablation is not stopped in time, the sensor area will be damaged. When the sensor area is damaged, correct operation of the entire semiconductor sensor chip is no longer guaranteed.

SUMMARY

In various embodiments, a chip may include a substrate; a coating, the coating covering the substrate at least partially and the coating being designed for being stripped at least partially by means of laser ablation; wherein between the substrate and the coating, a laser detector layer is arranged at least partially, the laser detector layer being designed for generating a detector signal for ending the laser ablation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
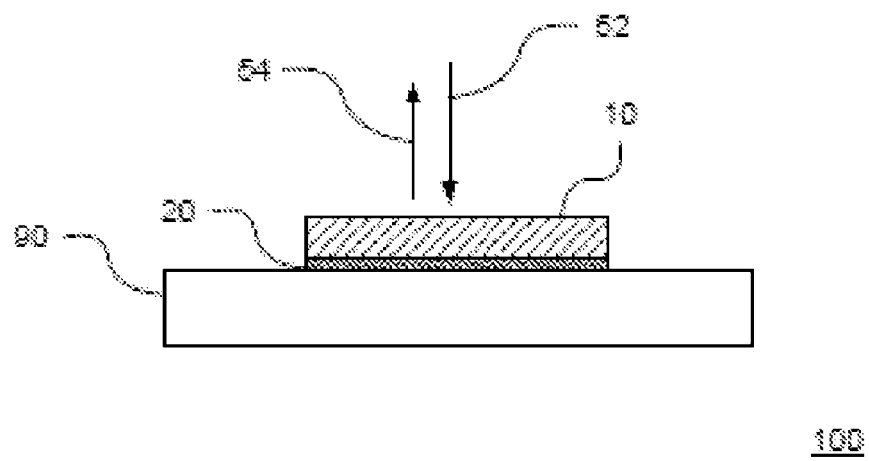
FIG. 1 shows various embodiments of a chip.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In the text which follows, various embodiments of the chip and of the device for laser ablation, respectively, are explained in greater detail.

Various embodiments provide a chip, a method for producing a chip and a device for laser ablation in which a coating of a chip can be stripped in an improved manner by means of laser ablation.

In various embodiments, the chip may include a substrate with a coating, the coating covering the substrate at least partially and the coating being designed for being stripped at least partially by means of laser ablation, a laser detector layer being arranged at least partially between the substrate and the coating, the laser detector layer being designed for generating a detector signal for ending the laser ablation. The chip may be a semiconductor chip.

Chips, especially semiconductor chips which are subjected to increased loading, can be provided, for example, with a coating or they are embedded partially or completely in a casting compound. Increased loadings occur, for example, in the motor vehicle technology or in industrial applications in the form of vibrations, chemical substances, dust, moisture, corrosion etc. The coating or casting compound can be, for example, resins and plastics.

The coating of a chip can exhibit or be, for example, a polymer, for example the polymer parylene. Parylene is a hydrophobic, chemically resistant coating having a good bather effect with respect to inorganic and an organic media, strong acids, alkalis, gases and water vapor. As a thin and transparent coating having a high gap penetration capability, parylene is suitable for complex-structured substrates also on edges.

The chip can exhibit a micro-electro-mechanical system (MEMS) or a micro-opto-electro-mechanical system (MOEMS). An MEMS is the integration of mechanical elements, sensors, actuators and electronics on one common substrate, e.g. one common silicon substrate. In an MOEMS, optical elements such as waveguides, optical fibers etc. are added. However, the chip can also be a single sensor chip.

As a rule, sensors have a sensor area/sensor diaphragm and a non-sensitive area. Whereas the non-sensitive area can be protected well, for example by means of a coating or a casting, against external influences, the actual sensor area should be free of a coating which may influence the operation of the sensor negatively. Apart from optical sensor areas, there are, for example, also sensor areas for mechanical parameters such as pressure and force, and fluid-sensitive areas which provide for gas analyses and fluid analyses, and temperature-sensitive sensor areas.

Using laser ablation, a coating material, for example a coating above a sensor area, can be stripped, for example, by bombardment with pulsed laser radiation. By means of the at least partial arrangement according to the invention of a laser detector layer between the substrate of the chip and the coating to be stripped, a detector signal is generated when the laser beam impinges on the laser detector layer. The detector signal may be detected by means of a detector or evaluating electronics and used for controlling or stopping, respectively, the further laser ablation process. This prevents the substrate surface laying underneath the coating being damaged by the laser beam.

In various embodiments, the laser detector layer may be a fluorescent layer, for example a stilbene layer or a fluorescent resist. The fluorescent resist can be applied to the chip in the form of a mask. This may be, for example, a photoresist based on epoxides or acrylates. Suitable florescent materials can be mixed into the photoresist and applied at wafer level.

In various embodiments, the detector signal would be the light emitted by the fluorescent layer. When the laser beam is applied to the fluorescent layer, light emitted for a short time and spontaneously is produced, the emitted light, as a rule, having less energy than that previously absorbed. In this context, the excitation wavelength of the laser can be within the range of absorption of the fluorescent layer. At the same time, the fluorescent layer may have a high quantum yield of florescence at the laser excitation wavelength. The emitted light may then be received, for example, by means of a highly sensitive photodiode, for example an avalanche photodiode or another light sensor and evaluated by means of fast electronics and used for controlling the laser ablation process. Via the highly sensitive photodiode, the intensity of florescence is integrated over time, triggering being effected via a reliable and characteristic signal in order to ensure that the coating is stripped down to the fluorescent layer. The time gradient or turnover point of the intensity signal, respectively, may be used as characteristic signal. The further advanced the laser ablation process, the thinner the coating still to be stripped and the higher the intensity of the light emitted.

The laser ablation may be carried out with a pulsed excimer laser, in which the coating, for example the polymer layer, and the florescent layer are within the absorption of the laser wavelength. However, the florescent dye of the fluorescent layer may have a distinctly higher quantum yield of florescence than the coating. After the laser ablation, the fluorescent layer/mask may be removed, for example by means of a suitable solvent.

In various embodiments, the laser detector layer may be based on the operation of a radiation detector and thus on electromagnetic interactions of the photons of the laser beam with the electrons or atomic nuclei of the detector material, for example an inert gas or a semiconductor. Depending on the type of detector, there are different mechanisms of interaction. The most frequent one is the interaction with the electronics, the so-called photoeffect. If the energy of the photon is of equal magnitude or greater than the binding energy of the electron, the electron can be detached out of the atomic compound via the photon. By applying an electrical field, this electron is allowed to drift to the anode where it can be detected by measuring the electric current or the electrical charge. In various embodiments, the electron would be the detector signal. The light of the laser beam may knock out the valence electrons which are bound relatively weakly. The energy of the electron is equal to the difference of the energy of the incident photon and the binding energy of the electron. If the energy of the electron is high enough, it may ionize further atoms so that numerous electrons become free and may be detected. For various embodiments, too, it applies that the more the laser ablation process has advanced, the thinner the coating still to be stripped and the stronger the intensity of the detected signal.

In various embodiments, the chip exhibits a contact area, the coating covering the contact area at least partially. The coating above the contact and at another point on the chip may also be stripped simultaneously by means of a beam multiplier or another mirror/lens arrangement, respectively. For example, the coating on the contact area and the coating above the sensor area may be stripped simultaneously by such an arrangement.

In summary, it is noted that the depth of stripping may be limited by using a laser detector layer between the coating of the chip and the substrate of the chip. During the laser ablation process, the laser beam is detected by the laser detector layer. The laser ablation process is selectively controlled or stopped, respectively, by the detector signal so that there is no damage to the chip surface underneath the coating to be stripped. Due to the laser detector layer according to the invention and the detector signal emitted by it, any damage to the substrate surface is thus prevented and, as a result, the rejection rate in the production is significantly lowered.

In various embodiments, a device for laser ablation exhibits a laser, the laser being arranged for stripping a coating from a chip, a detector, the detector being designed for detecting a detector signal which is emitted by a laser detector layer applied to the chip.

In this context, the detector can be a photodiode and the detector signal may be a light signal. The light signal, which may be emitted light, is received by the photodiode, for example a highly sensitive avalanche photodiode, and evaluated by means of fast electronics, and used for controlling the laser ablation process. If the light signal is, for example, light emitted by a florescent layer, the intensity of florescence may be integrated over time, for example via a highly sensitive photodiode, thus ensuring that the coating is only stripped down to the florescent layer.

For the laser ablation, the stripping of material from a surface by bombardment with a laser beam, a pulsed excimer laser may be used, for example. The laser beam used may have a high power density. The high power density leads to a rapid heating of the material on the surface of the coating and lastly to its evaporation. The laser beam is detected when it reaches the laser detector layer, at the latest. The detector signal is used for controlling or stopping, respectively, the laser ablation process selectively before the substrate surface underneath the coating to be stripped is damaged.

In various embodiments, the device for laser ablation can additionally exhibit a mirror and/or lens arrangement, the mirror and/or lens arrangement being designed for dividing and/or focusing a laser beam of the laser. By means of a so-called beam multiplier, a number of areas of the coating can be stripped simultaneously, for example, during the laser ablation process. On the one hand, this can be a first coating area above a sensor area and, on the other hand, this can be a second coating area above a contact area.

In various embodiments for a method for producing a chip, the method exhibits the following: applying a laser detector layer onto a substrate of the chip, applying a coating onto the substrate of the chip, stripping the coating by means of a laser, generating a detector signal by the laser detector layer when a laser beam generated by the laser impinges on the laser detector layer, detecting the detector signal, controlling the laser ablation on the basis of the detector signal.

In various embodiments, the laser detector layer applied can be a florescent layer, for example a stilbene layer or a florescent resist. The florescent resist may be applied to the chip in the form of a mask. This may be, for example, a photoresist based on epoxides or acrylates. Suitable florescent materials may be added to the photoresist and applied at wafer level. After the laser ablation, the florescent layer/mask may be removed, for example by means of a suitable solvent.

In various embodiments the laser detector layer applied may be based on the operation of a radiation detector and thus on electromagnetic interactions of the photons of the laser beam with the electrons or atomic nuclei of the detector material, for example inert gases or semiconductors.

Chips, especially semiconductor chips, which are subjected to increased loading, may be provided, for example, with a coating as protection. The substrate of the chip may be coated, for example, with a polymer, for example the polymer parylene.

In various embodiments of the method for producing a chip, the substrate exhibits a sensor area and the method also exhibits the following: applying the laser detector layer to the sensor area of the chip, stripping the coating above the sensor area by means of the laser. The substrate of the chip may be, for example, an MEMS, an MOEMS or a sensor. As a rule, sensors have a sensor area/sensor diaphragm and a non-sensitive area. Whereas the non-sensitive area can be protected well, for example by means of a coating or casting, against external influences, the actual sensor area should be free of a coating which could influence the operation of the sensor negatively.

In various embodiments, the chip exhibits a contact area, wherein the contact area may be covered at least partially by the coating. By using a beam multiplier, the coating above the contact and, for example, the coating above the sensor area can be stripped simultaneously.

By applying the laser detector layer between the substrate of the chip and the coating to be stripped, the depth of stripping can be limited by means of a detector signal generated. The laser detector layer applied detects the impinging laser beam during the laser ablation process and controls or stops, respectively, the laser ablation process on the basis of the detected signal. Any damage to the chip surface is thus prevented by applying a laser detector layer according to the invention and by the detector signal generated by it.

FIG. 1 shows an exemplary embodiment of a chip 100. The chip 100 has a substrate 90 with a coating 10, wherein the coating 10 covers the substrate 90 at least partially and wherein the coating 10 is designed for being stripped by a laser beam 52 at least partially by means of laser ablation, a laser detector layer 20 being arranged at least partially between the substrate 90 and the coating 10, the laser detector layer 20 being designed for generating a detector signal 54 for ending the laser ablation. The chip 100 may be a semiconductor chip.

The coating 10 of the chip 100 may exhibit or be, for example, a polymer, for example the polymer parylene. The chip 100 itself may exhibit an MEMS, an MOEMS or a sensor.

The laser detector layer 20 may be a florescent layer and the associated detector signal may be the light emitted by it. The florescent layer may be, for example, a stilbene layer or a florescent resist. The florescent resist may be applied to the chip 100 in the form of a mask. It may be, for example, a photoresist. Suitable florescent materials may be mixed with the photoresist and applied at wafer level. However, the laser detector layer 20 may also be based on the operation of a radiation detector and thus on electromagnetic interactions of the photons of the laser beam 52 with the electrons or atomic nuclei of the detector material. The detector signal would then be an electrical signal.

In a further exemplary embodiment, the chip 100 may exhibit a contact area 40, wherein the coating 10 may cover the contact area 40 at least partially.

It is noted that, by using a laser detector layer 20 between the coating 10 of the chip 100 and the substrate 90 of the chip 100, and the detector signal 54 generated by it, the depth of stripping may be limited so that there is no damage to the substrate 90 of the chip 100 underneath the coating 10 to be stripped during the laser ablation process.

Figure 2:
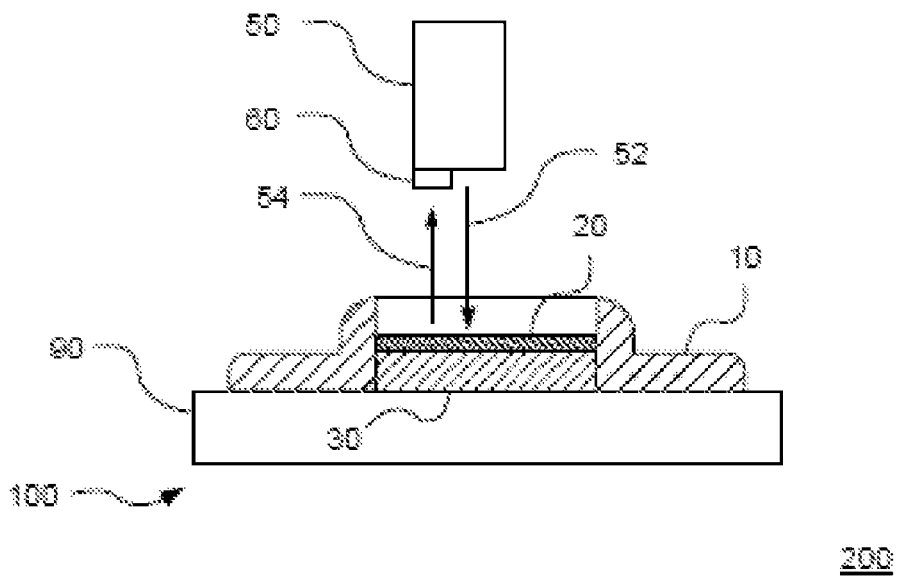
FIG. 2 shows various embodiments of a device for laser ablation with a chip.

FIG. 2 shows various embodiments of a device for laser ablation 200 with a chip 100. The device for laser ablation 200 exhibits a laser 50, the laser 50 being arranged for stripping a coating from a chip 100, and a detector 60, the detector 60 being designed for detecting a detector signal 54 which is emitted by a laser detector layer 20 applied to the chip 100.

The substrate 90 of the chip 100 may be a sensor. As a rule, sensors exhibit a sensor area 30 and a non-sensitive area. Whereas the non-sensitive area may be protected well, for example by means of the coating 10, against external influences, the actual sensor area 30 should be free of any coating 10 which could influence the operation of the sensor negatively. The sensor area 30 is exposed by the laser ablation.

As a laser 50 for the laser ablation, a pulsed excimer laser may be used, for example. The laser beam 52 may have a high power density. The high power density leads to a rapid heating of the material on the surface of the coating 10 and lastly to its evaporation. The detector 60 detects the laser beam 52 where it reaches the laser detector layer 20, at the latest. The detected signal 54 is used for controlling or stopping, respectively, the laser ablation process selectively before the surface of the sensor area 30 is damaged underneath the coating 10 to be stripped.

In this context, the detector 60 may be a photodiode and the detector signal 54 a light signal. The light signal, this may be emitted light, is received by the photo diode, for example a highly sensitive avalanche photodiode, and evaluated by means of fast electronics and used for controlling the laser ablation process.

Figure 3:
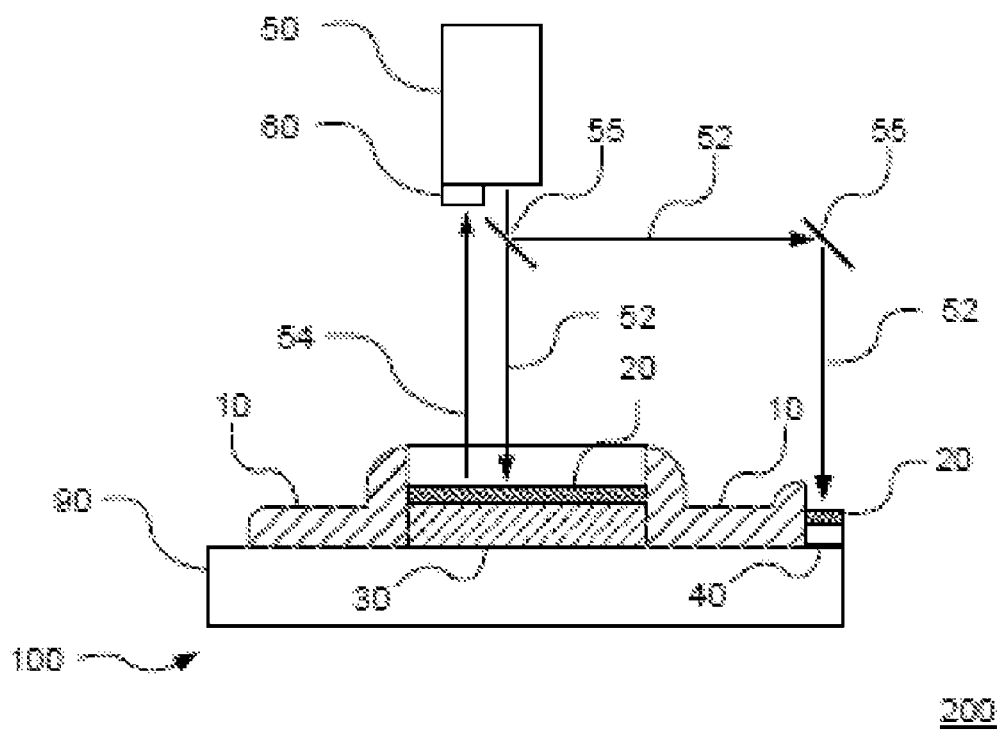
FIG. 3 shows various embodiments of a device for laser ablation with a chip.

FIG. 3 shows various embodiments of a device for laser ablation 200 with a chip 100. The device for laser ablation 200 additionally exhibits a mirror and/or lens arrangement 55, the mirror and/or lens arrangement 55 being designed for dividing and/or focusing a laser beam 52 of the laser. By means of a so-called beam multiplier, a number of areas of the coating 10 may be stripped simultaneously during the laser ablation process. On the one hand, this may be a first coating area above a sensor area 30 and, on the other hand, a second coating area above a contact area 40.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip, comprising:
   a substrate; and
   a coating, the coating covering the substrate at least partially and the coating being designed for being stripped at least partially by means of laser ablation;
   wherein between the substrate and the coating, a laser detector layer is arranged at least partially, the laser detector layer being designed for generating a detector signal for ending the laser ablation.

2. The chip as claimed in claim 1,
   wherein the chip is a semiconductor chip.

3. The chip as claimed in claim 2,
   wherein the chip comprises an MEMS or an MOEMS.

4. The chip as claimed in claim 1,
   wherein the laser detector layer is a florescent layer.

5. The chip as claimed in claim 4,
   wherein the florescent layer is a stilbene layer.

6. The chip as claimed in claim 1,
   wherein the chip comprises a contact area; and
   wherein the coating covers the contact area at least partially.

7. The chip as claimed in claim 1,
   wherein the coating is a polymer layer.

8. The chip as claimed in claim 7,
   wherein the coating is of parylene.

9. A device for laser ablation, comprising:
   a laser, the laser being arranged for stripping a coating from a chip; and
   a detector, the detector being designed for detecting a detector signal which is emitted by a laser detector layer applied to the chip.

10. The device for laser ablation as claimed in claim 9,
    wherein the detector is a photodiode; and
    wherein the detector signal is a light signal.

11. The device for laser ablation as claimed in claim 9,
    wherein the device for laser ablation comprises additionally at least one of a mirror and a lens arrangement, the at least one of a mirror and a lens arrangement being designed for at least one of dividing and focusing a laser beam of the laser.

12. The device for laser ablation as claimed in claim 9,
    wherein the laser is an excimer laser.

13. A method for producing a chip, the method comprising:
    applying a laser detector layer onto a substrate of the chip;
    applying a coating on the substrate of the chip;
    stripping the coating by means of a laser;
    generating a detector signal by the laser detector layer when a laser beam generated by the laser impinges on the laser detector layer;
    detecting the detector signal; and
    controlling the laser ablation on the basis of the detector signal.

14. The method for producing a chip as claimed in claim 13,
    the chip comprising a sensor area;
    the method further comprising:
        applying the laser detector layer to the sensor area of the chip; and
        stripping the coating above the sensor area by means of the laser.

15. The method for producing a chip as claimed in claim 13,
    the substrate comprising a contact area;
    the method further comprising:
        applying the laser detector layer onto the contact area of the chip;
        stripping the coating above the contact area by means of the laser.

16. The method for producing a chip as claimed in claim 13,
    the laser detector layer being a florescent layer and the associated detector signal being a light signal;
    the method further comprising:
        measuring the radiation intensity of the light signal by means of a photodiode;
        controlling the laser ablation on the basis of the radiation intensity.

17. The method for producing a chip as claimed in claim 13,
    the laser ablation being ended when the laser detector layer is reached.

* * * * *